US012444664B2

(12) United States Patent
Smalley et al.

(10) Patent No.: US 12,444,664 B2
(45) Date of Patent: Oct. 14, 2025

(54) LOADING FRAME FOR HIGH I/O COUNT PACKAGED SEMICONDUCTOR CHIP

(71) Applicant: SK Hynix NAND Product Solutions Corp., Rancho Cordova, CA (US)

(72) Inventors: Jeffory L. Smalley, Olympia, WA (US); Mohanraj Prabhugoud, Hillsboro, OR (US); Steven A. Klein, Chandler, AZ (US); Mengqi Liu, Hillsboro, OR (US)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 842 days.

(21) Appl. No.: 17/132,391

(22) Filed: Dec. 23, 2020

(65) Prior Publication Data

US 2021/0183737 A1  Jun. 17, 2021

(51) Int. Cl.
*H01L 23/40* (2006.01)
*H01L 23/495* (2006.01)

(52) U.S. Cl.
CPC .... *H01L 23/4006* (2013.01); *H01L 23/49544* (2013.01); *H01L 23/49551* (2013.01); *H01L 23/49568* (2013.01); H01L 2023/405 (2013.01)

(58) Field of Classification Search
CPC ............ H01L 21/4882; H01L 23/4006; H01L 23/4093; H01L 23/427; H01L 23/49544; H01L 23/49551; H01L 23/49568; H01L 2023/4031; H01L 2023/405; H01L 2023/4062; H01L 2023/4081; H01L 2023/4087; H01L 2023/4093; H01R 12/51; H01R 12/523; H01R 12/7023; H01R 12/7047; H01R 12/7064; H01R 12/7082; H01R 12/7088; H01R 12/716; H01R 12/777; H01R 12/778; H01R 12/88; H05K 1/0203; H05K 1/0263; H05K 1/11; H05K 1/181; H05K 7/10; H05K 7/1092; H05K 7/1431; H05K 7/20; H05K 7/2049; H05K 7/20436; H05K 7/20509; G06F 1/20
See application file for complete search history.

(56) References Cited

U.S. PATENT DOCUMENTS

| | | | | |
|---|---|---|---|---|
| 6,809,929 | B2* | 10/2004 | Liu | ...... H01L 21/4882 257/710 |
| 9,681,556 | B2 | 6/2017 | Llapitan et al. | |
| 10,455,685 | B1 | 10/2019 | Klein et al. | |
| 2004/0066627 | A1* | 4/2004 | Liu | ...... H01L 21/4882 257/E23.083 |

(Continued)

FOREIGN PATENT DOCUMENTS

| | | | | |
|---|---|---|---|---|
| CN | 111124069 A | * | 5/2020 | ............ G06F 1/184 |
| TW | 201316155 A | | 4/2013 | |

OTHER PUBLICATIONS

CN-111124069-A English Translation (Year: 2020).*

(Continued)

*Primary Examiner* — Amir A Jalali
(74) *Attorney, Agent, or Firm* — Haley Guiliano LLP

(57) ABSTRACT

An apparatus is described. The apparatus includes a loading frame for mounting a packaged semiconductor chip and a heat sink for the packaged semiconductor chip to a socket. The loading frame is comprised of metal. The loading frame has at least one frame leg where the metal is folded to re-enforce a strength of the frame leg.

20 Claims, 17 Drawing Sheets

(56) References Cited

U.S. PATENT DOCUMENTS

| | | | |
|---|---|---|---|
| 2005/0068740 A1* | 3/2005 | Ulen | H01L 23/4006 |
| | | | 257/E23.087 |
| 2013/0342989 A1 | 12/2013 | Singleton | |
| 2014/0071647 A1* | 3/2014 | Bridges | H01L 23/40 |
| | | | 361/783 |
| 2014/0092573 A1* | 4/2014 | Llapitan | H05K 7/1007 |
| | | | 257/E23.179 |
| 2016/0183375 A1 | 6/2016 | Krithivasan et al. | |
| 2018/0252483 A1 | 9/2018 | Geng et al. | |
| 2019/0302857 A1 | 10/2019 | Buddrius et al. | |
| 2019/0304869 A1* | 10/2019 | Larson | H01L 23/4093 |
| 2019/0306985 A1* | 10/2019 | Ferguson | H01R 12/88 |
| 2020/0053438 A1* | 2/2020 | Munoz | G02B 6/4292 |
| 2020/0328135 A1* | 10/2020 | Harvey Terhune, IV | |
| | | | H01L 23/4006 |
| 2020/0335432 A1 | 10/2020 | Murtagian et al. | |
| 2020/0411410 A1* | 12/2020 | Klein | H01L 23/427 |
| 2021/0183737 A1* | 6/2021 | Smalley | H01L 23/49551 |
| 2021/0307153 A1* | 9/2021 | Mohammad | H05K 7/1061 |
| 2022/0102887 A1* | 3/2022 | Cheng | H05K 7/1069 |
| 2023/0197622 A1* | 6/2023 | Meyyappan | H01L 23/5384 |
| | | | 257/737 |

OTHER PUBLICATIONS

U.S. Appl. No. 16/828,447, filed Mar. 24, 2020, "Socket Load Regulation Utilizing CPU Carriers With Shim Components", 38 pages.

Geng, Phil, "Structural Design of Land Grid Array Loading Mechanisms for Intel Central Processor Unit Stack Retention", Journal of Electronic Packaging, Mar. 2019, 8 pages, vol. 141 / 010801-1-010801-8, ASME, published online.

Taiwanese and English Translation of Taiwan IPO Search Report for Patent Application No. 110134954, , Mailed Feb. 12, 2025, 2 pages.

* cited by examiner

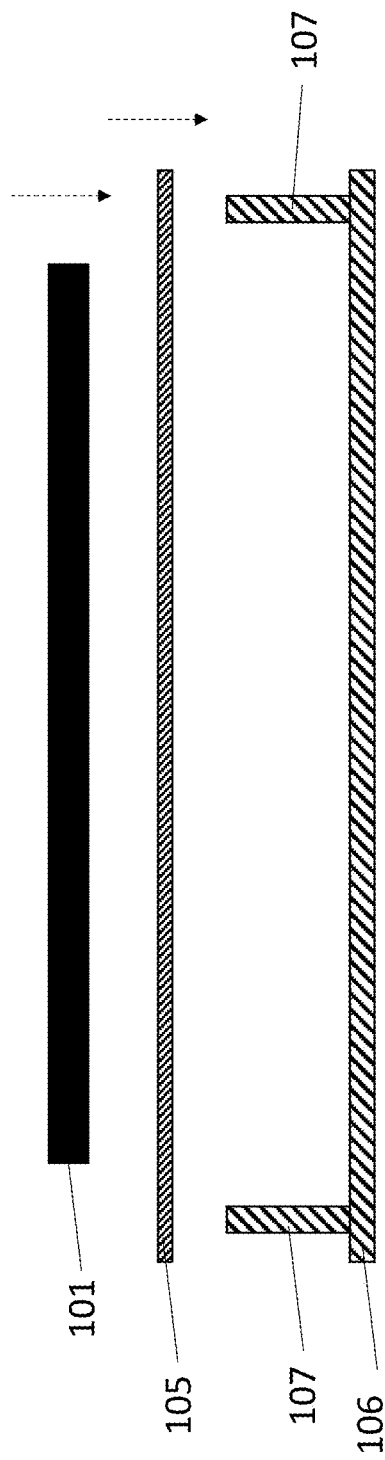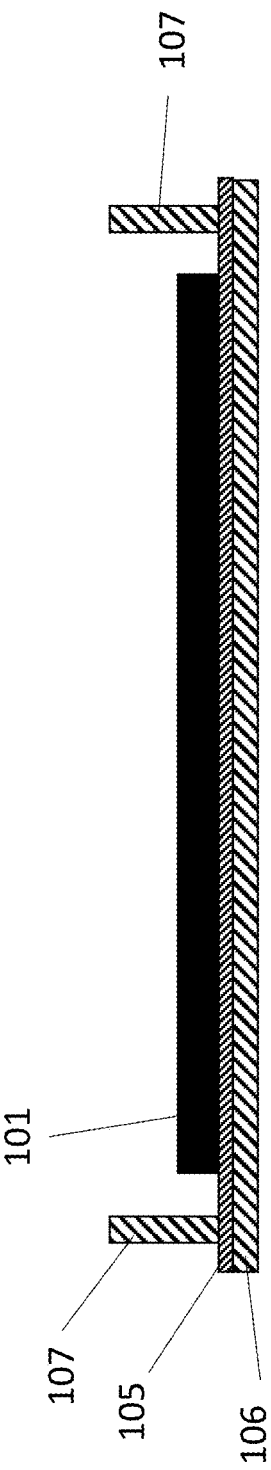

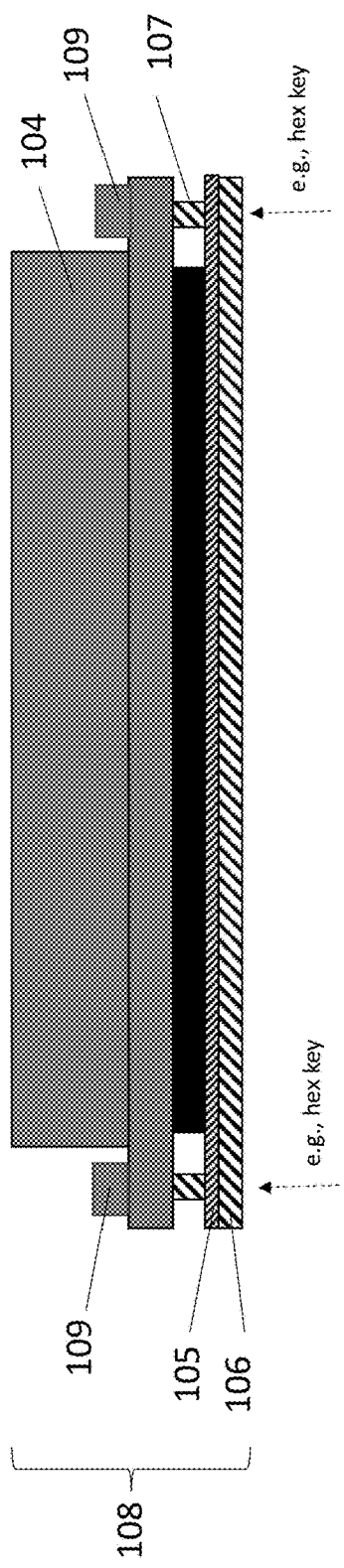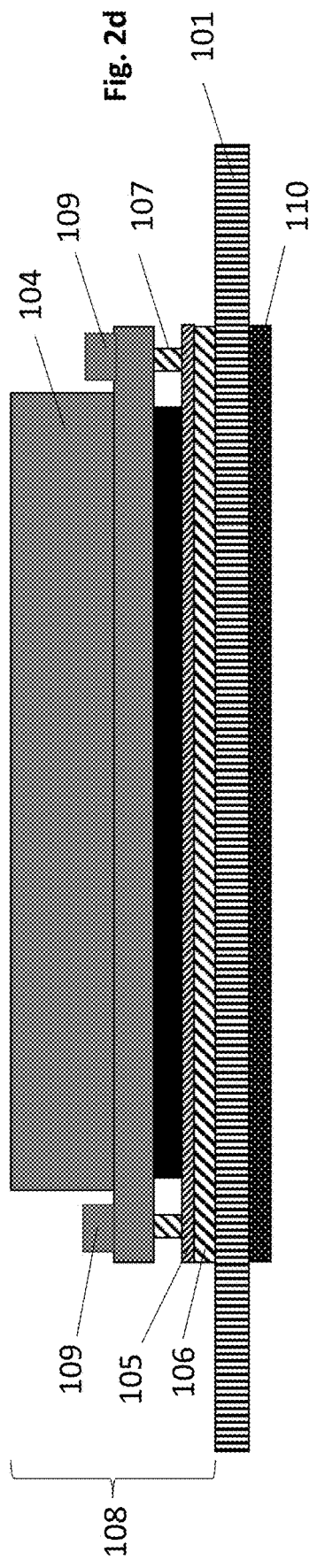

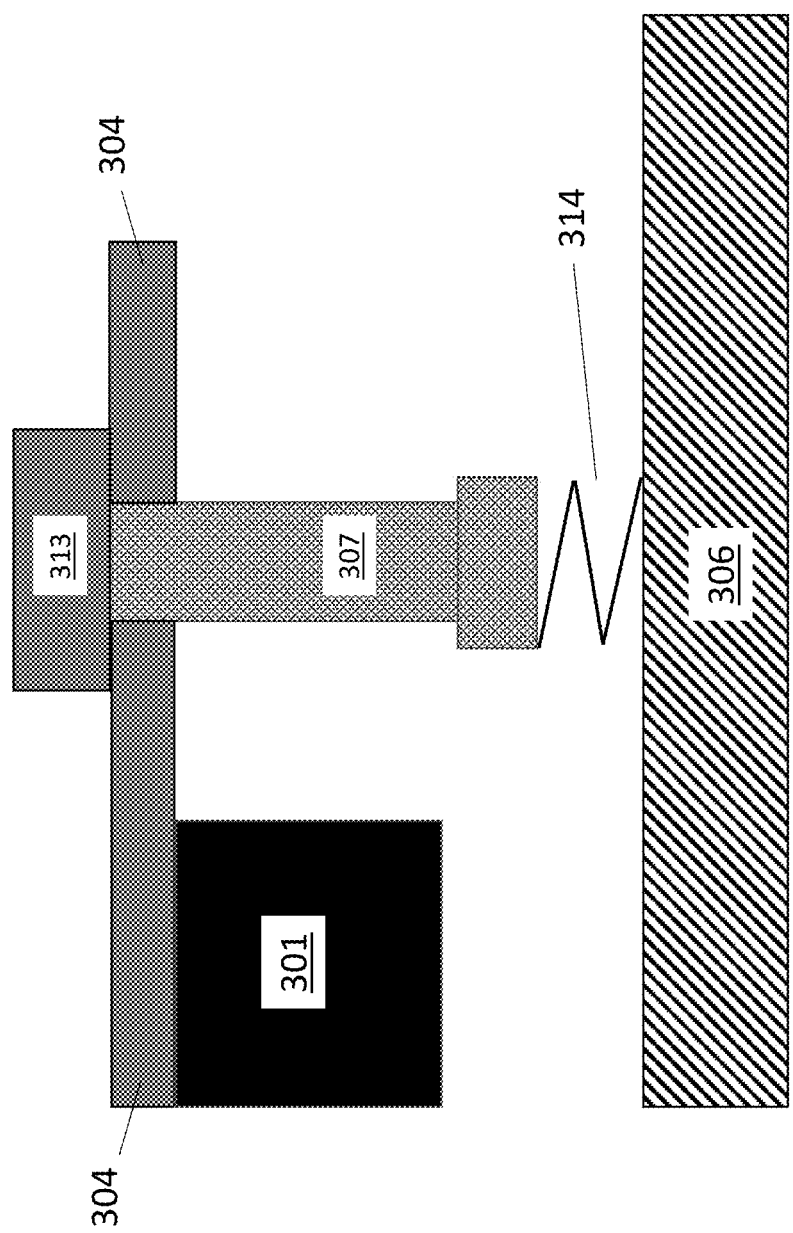

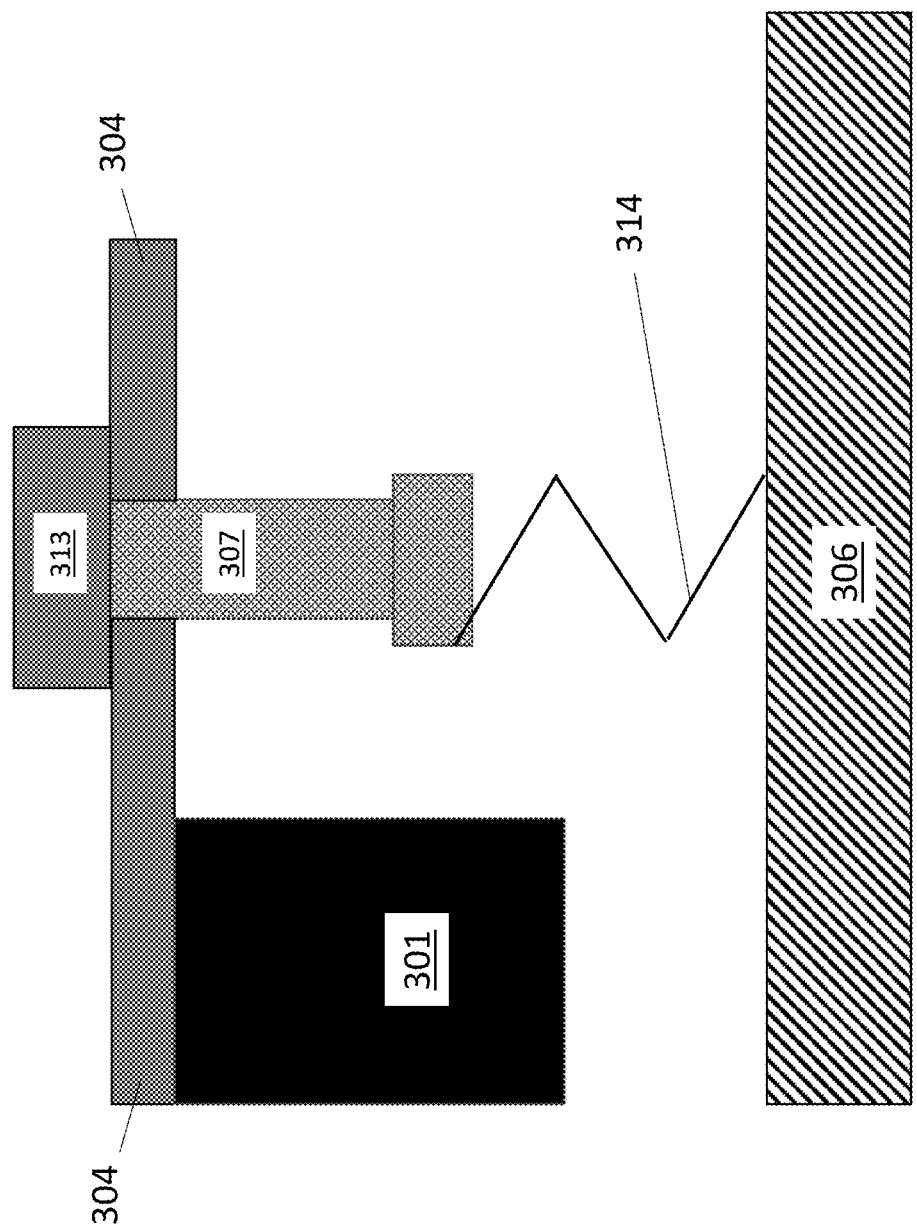

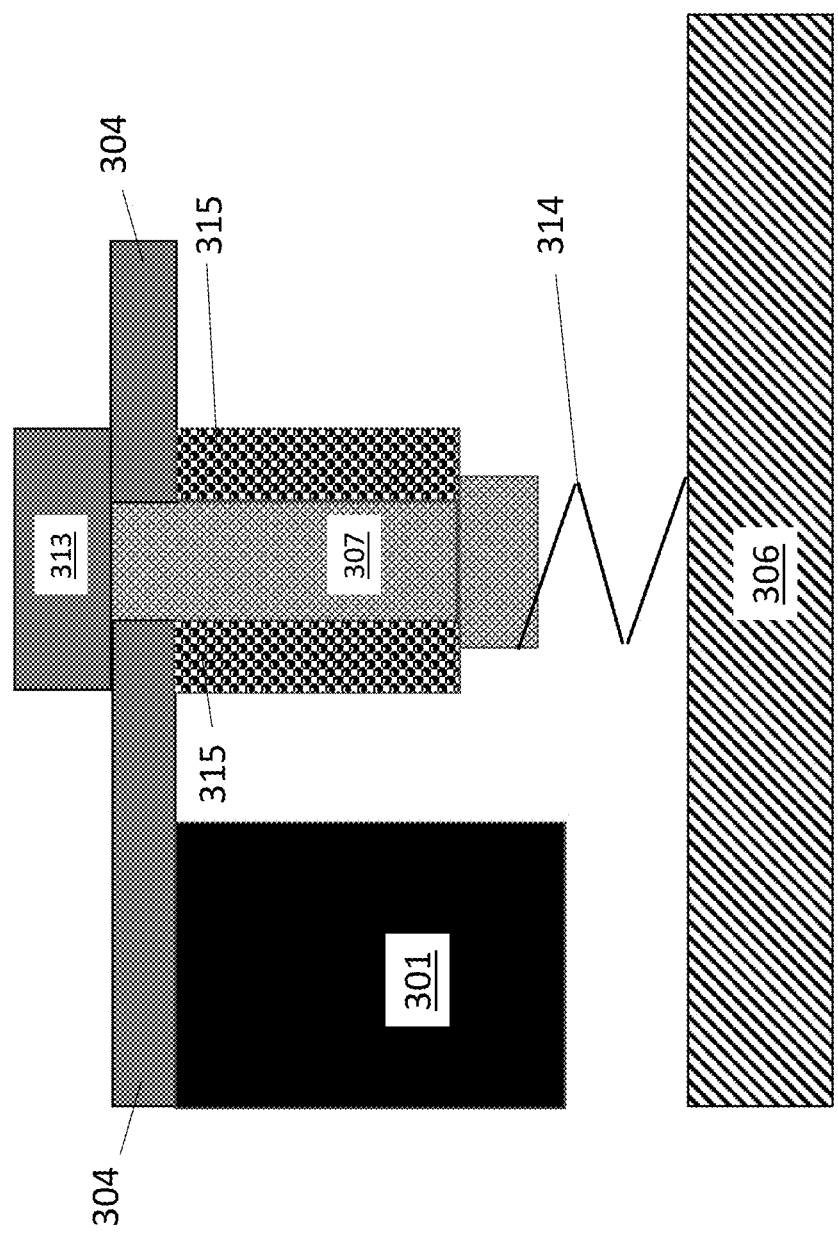

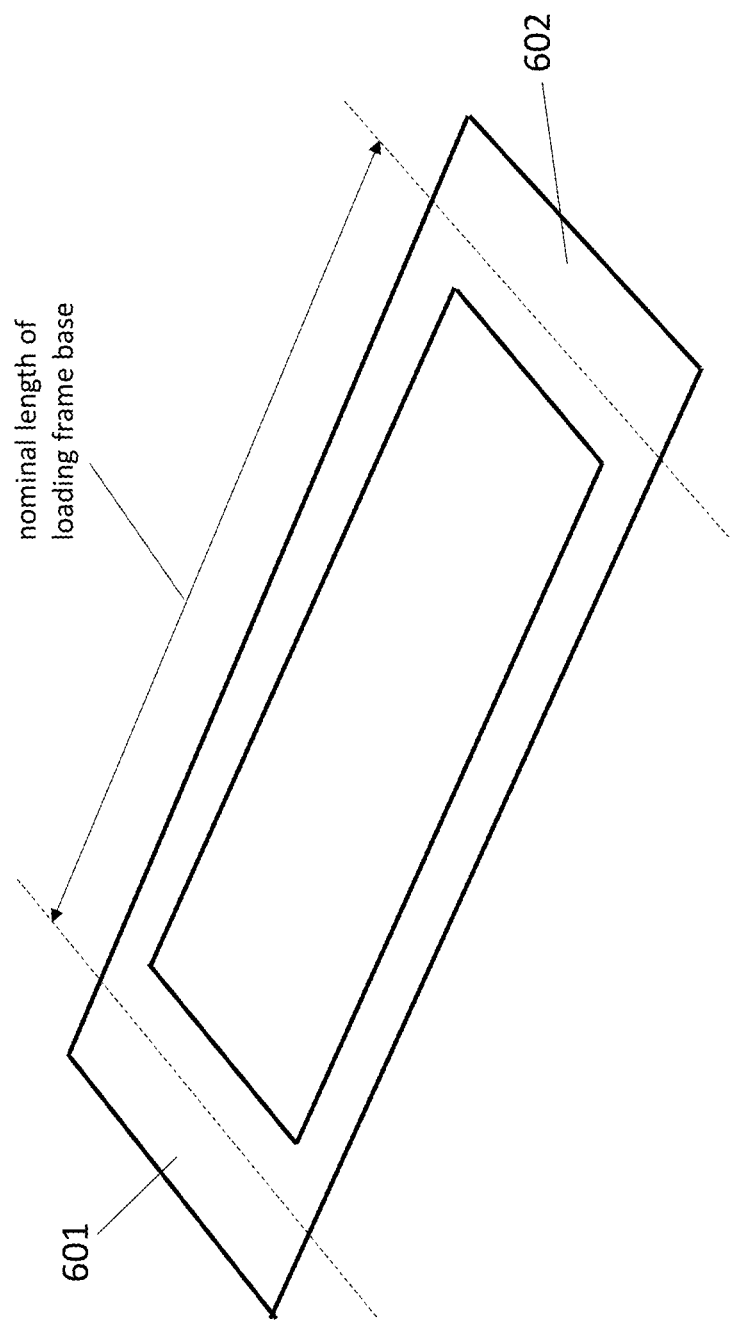

LOADING FRAME FOR HIGH I/O COUNT PACKAGED SEMICONDUCTOR CHIP

BACKGROUND

With the onset of cloud computing, big data and other high performance compute centric environments (e.g., data center environments), system administrators are increasingly looking for new ways to pack as much functionality into as small a space as is practicable. However, increasingly difficult component integration challenges are presenting themselves, particularly with respect to packaging and integration of high performance system on chip semiconductor packages into their respective electronic systems.

FIGURES

A better understanding of the present invention can be obtained from the following detailed description in conjunction with the following drawings, in which:

FIGS. 2a, 2b, 2c and 2d show the mounting of a CPU and heat sink to a socket;

FIGS. 3a, 3b, 3c, 3d and 3e show a stud for mounting a heat sink to a loading frame;

FIGS. 6a and 6b show a loading frame base;

DETAILED DESCRIPTION

Figure 1:
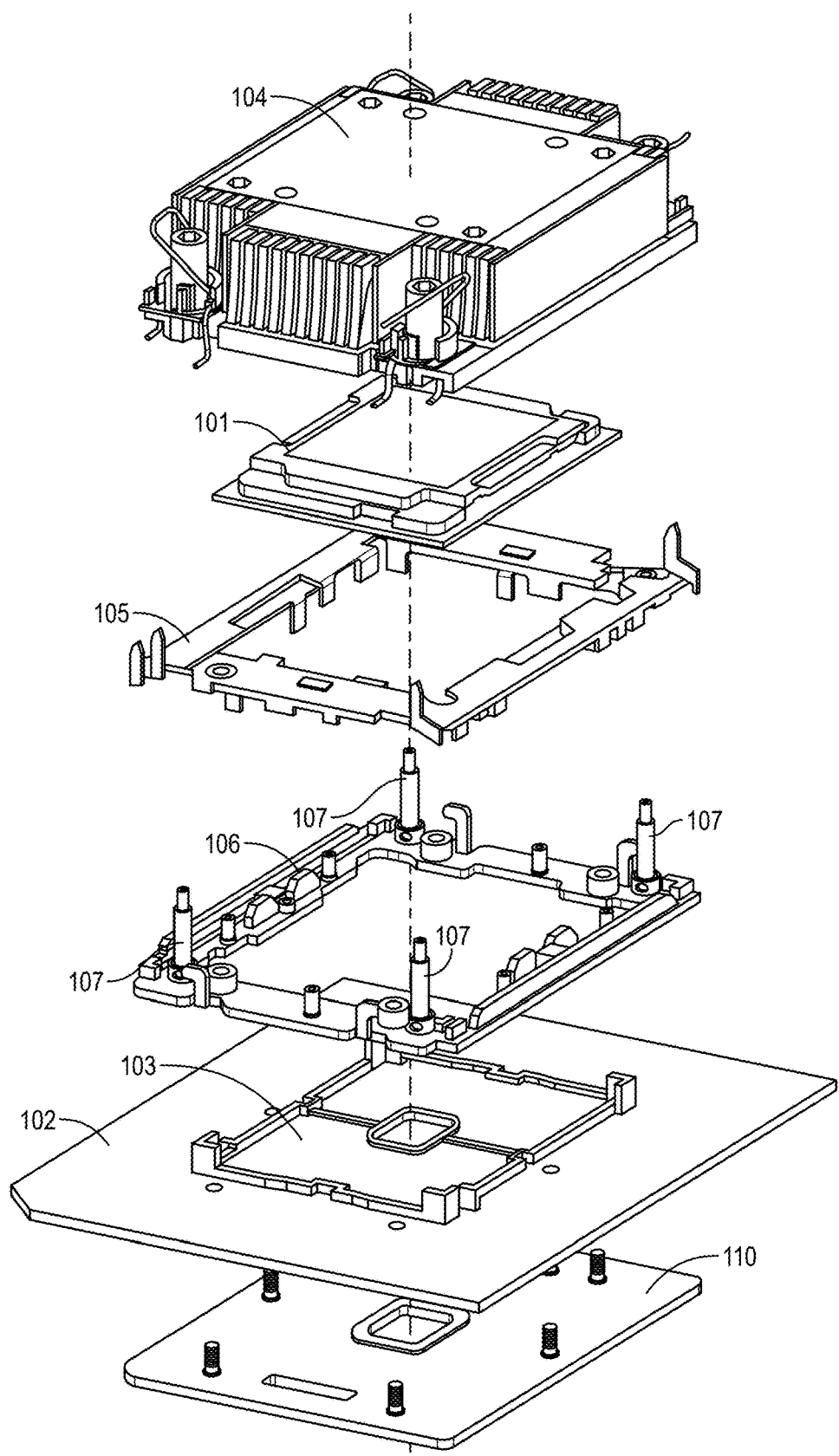
FIG. 1 shows an exploded view of a first embodiment of a CPU with heat sink and socket assembly.

FIGS. 1 and 2a through 2d depict a mechanical assembly that mounts a high performance system on chip 101 (SOC), such as a multi-core processor ("CPU"), to a system motherboard 102 (e.g., FIG. 1 shows an exploded view of a complete assembly, FIGS. 2a through 2d show a side view of the assembly construction sequence). As observed in FIG. 1, the motherboard 102 includes a connector 103 (hereinafter, "socket") having electrical interface contacts (e.g., pads) that are to mate with corresponding electrical interface contacts (e.g., balls) on the underside of the CPU 101.

The CPU 101, when operating, draws large amounts of electrical power and dissipates large amounts of heat. A heat sink 104 is therefore mounted to the CPU 101 to draw heat away from the CPU 101 while the CPU 101 operates. Here, the bottom face of the heat sink 104 physically contacts the upper surface of the CPU package 101 to form a thermal interface between the two components.

In order to mount the heat sink 104 to the CPU 101, referring to FIG. 1 and FIGS. 2a and 2b, the CPU 101 is placed on a carrier 105 and the carrier 105 is mounted on a loading frame 106. The carrier 105 has holes in its corners that align with studs 107 that extend upward from the loading frame 106. The studs 107 are inserted through the holes to align the carrier and CPU 101 on the loading frame 106.

Referring to FIG. 2c, the heat sink 104 is then placed on the top of the CPU package 101 and mounted to the loading frame 106 in a manner that compresses the heat sink/CPU/carrier/loading frame together in a compact assembly 108. Here, as described in more detail below, the tip of the studs 107 are threaded (not shown in FIG. 2c) and the heat sink has nuts 109 (or, other features for securing the studs to the heat sink exist). The studs are torqued (e.g., with a hex key) from the underside of the loading frame 106. A torsion spring (also not shown in FIG. 2c) is coupled between the head of each stud and the loading frame 106 to provide a compressive force that tightly pulls the heat sink 104 and loading frame 106 toward one another.

Referring to FIG. 2d, the assembly 108 is then mounted to a backing plate 110 on the backside of the motherboard 102. Here, the backing plate 110, motherboard 102 and loading frame 106 all have aligned holes through which studs are inserted and secured/tightened with nuts (not shown in FIG. 2d for simplicity).

The heat sink 104 is typically composed of a metal block (to create low thermal resistance between itself and the CPU package 101) with a number of milled fins (to affectively expand the surface area that the heat sink radiates heat from). The metal block is also designed to be a large mass so that it can "draw" the CPU's heat. Because the heat sink is essentially a large block of metal, the heat sink typically has significant mass (is heavy).

The electrical interface connections between the motherboard 102 and the CPU 101 can damage if most/all of the weight of the heat sink 104 were to be borne solely by the CPU 101, and, the heat sink 104 were to move (e.g., in response to a physical shock applied to the motherboard 102, heat sink 104 or the system that the motherboard 102 and heat sink 104 are integrated within). The purpose of the loading frame 106 is therefore to not only provide a platform that establishes physical contact between the CPU 101 and the heat sink 104, but also, support the weight of the heat sink 104 so that the CPU 101 supports only a small amount of the weight of the heat sink if any.

The carrier 105 serves as an interface that allows different kinds of CPUs to be mounted to a same loading frame 106. Here, the bottom surface of the carrier can be uniform across all types of CPUs so that it can mate to a same loading frame profile. The top surface of the carrier, however, is customized to receive the shape/form of a particular make/model of CPU.

The backing plate 110 provides structural support to the region of the motherboard 102 wherein the CPU 101 resides so that neither the motherboard 102 nor the CPU 101 support the weight of the heat sink 104 (rather, the weight is borne by the backing plate 110 and the loading frame 106). As such, if a mechanical shock were to be imparted to the system, the entire structure would remain stable (none of the components would move relative to one another) thereby protecting the electrical contacts between the motherboard 102 and the CPU 101.

Generally, it is desirable to use a same loading frame 106 for multiple CPU product lines, e.g., to minimize manufacturing costs across the product lines, and/or, allow users/customers can upgrade CPUs for a particular socket.

It is a challenge, however, to design a loading frame 106 that can accommodate different kinds of CPUs and their corresponding heat sinks. Here, for instance, certain CPUs can have taller CPU packages (e.g., higher performance CPUs), while, other CPUs can have thinner CPU packages (e.g., lower performance CPUs).

The difference in package height/thickness across multiple CPU types corresponds to a wide range of loads that the overall frame assembly 108 must be designed to support. A particular challenge can be the torsion force applied by the aforementioned torsion spring that couples the stud and the upper surface of the loading frame 106.

Figure 3A:
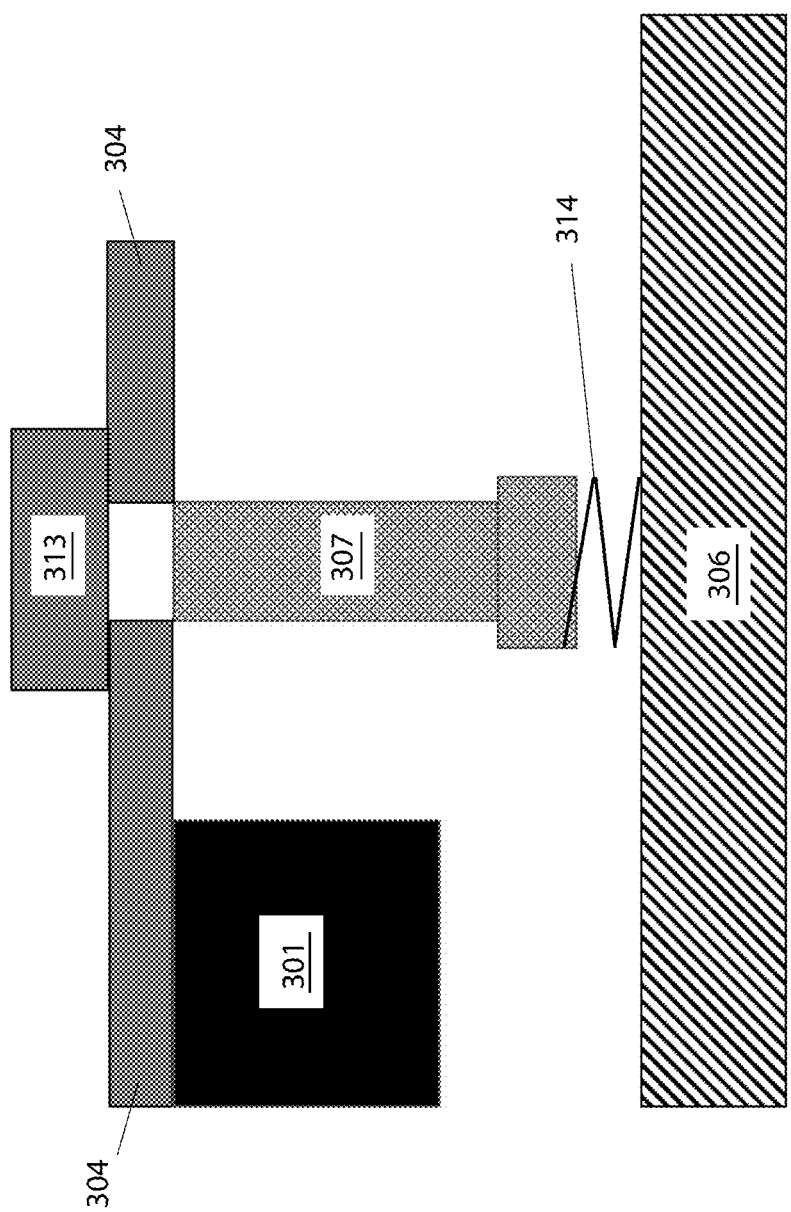
Figure 3C:
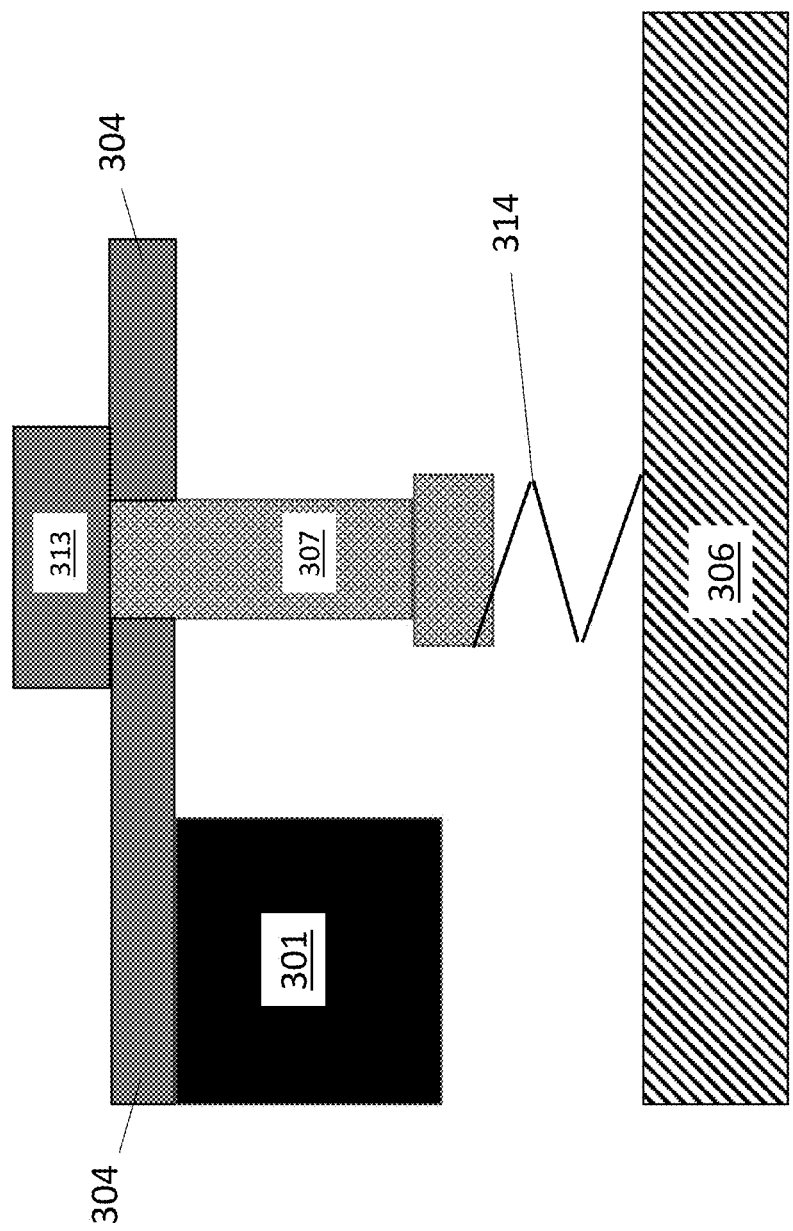

FIGS. 3a through 3c depict the securing 312 of a stud 307 to a heat sink nut 313. FIG. 3a shows an initial starting position after the heat sink 304 has been placed on the CPU 101 but not yet secured to the loading frame 306.

As the heat sink 304 is being mounted to the loading frame 306, referring to FIG. 3b, the stud 307 is engaged with the heat sink nut 313. The nut 313 is then tightened to the stud 307 as observed in FIG. 3c which tightly compresses the heat sink 304 and loading frame 306 together.

The stud 307 is mechanically coupled to the loading frame's base 306 with a torsion spring 314. Here, as the stud 307 is tightened to the heat sink nut 313, the stud 307 is pulled closer to the heat sink 304 and farther away from the loading frame base 306. Importantly, the retractive force of the torsion spring 314 increases as the stud 307 moves farther away from the loading frame base 306. That is, the more the stud 307 is drawn up into the heat sink 304 and pulls away from the loading frame base 306, the greater the torsion spring extension and corresponding force that tries to compress the heat sink 304 and loading frame 306 together.

Generally, there is a limit to how high the retractive force can be. That is, if the retractive force exceeds some threshold, damage can be imparted to the CPU package 301 and/or the electrical connections between the CPU package 301 and the socket.

Unfortunately, as different CPU packages can have different thicknesses/heights, a taller CPU package causes more torsion load in the load stud/heat sink interface than a thinner CPU package. That is, as the CPU package becomes taller, the heat sink sits higher above the loading frame base, in which case, the load stud must extend farther away from the loading frame base in order to fully engage with the heat sink. FIG. 3d shows a second scenario where the CPU package 301 is noticeably thicker than the CPU package 301 of FIG. 3c. The difference in torsion spring expansion between the scenarios of FIGS. 3c and 3d is readily apparent.

A solution is to insert a shim between the load stud and the heat sink for taller CPU packages so that the load stud does not have to move as far away from the loading stud base as it otherwise would if the shim were not present. That is, the shim essentially consumes at least some of the space that is created between the heat sink and load stud when a taller CPU package is involved. By consuming such space, the load stud does not have move away from the loading frame base in order to fully engage the heat sink.

FIG. 3e shows the scenario of FIG. 3d but where a shim 315 has been placed beneath the heat sink 304 to consume the additional distance between the location of the stud 307 when it is tightly secured by the nut 313 and the bottom of the heat sink 304. Comparing FIGS. 3c, 3d and 3e, note that the spring extension of FIG. 3e is the same as FIG. 3c but the thickness of the CPU package 101 of FIG. 3e is the same as the CPU package 101 of FIG. 3d.

In various embodiments, the shim has a thickness that corresponds to the threshold amount that the torsion spring can be extended before damage can occur. For those CPU package thicknesses that do not extend the torsion spring the threshold amount, the shim is not needed and is not used. For those CPU package thicknesses that would extend the spring beyond the threshold amount, the shim is needed and is used. The shim can be integrated with the loading frame or carrier depending on embodiment. According to one embodiment, the shim takes the form of a washer or C-clamp that is, e.g., rotated/pivoted about a post or axis on the frame/carrier to an engaged position beneath the heat sink if the shim is to be used, or, is rotated/pivoted about the post or axis to an alternate, non-engaged position if the shim is not to be used.

Figure 4:
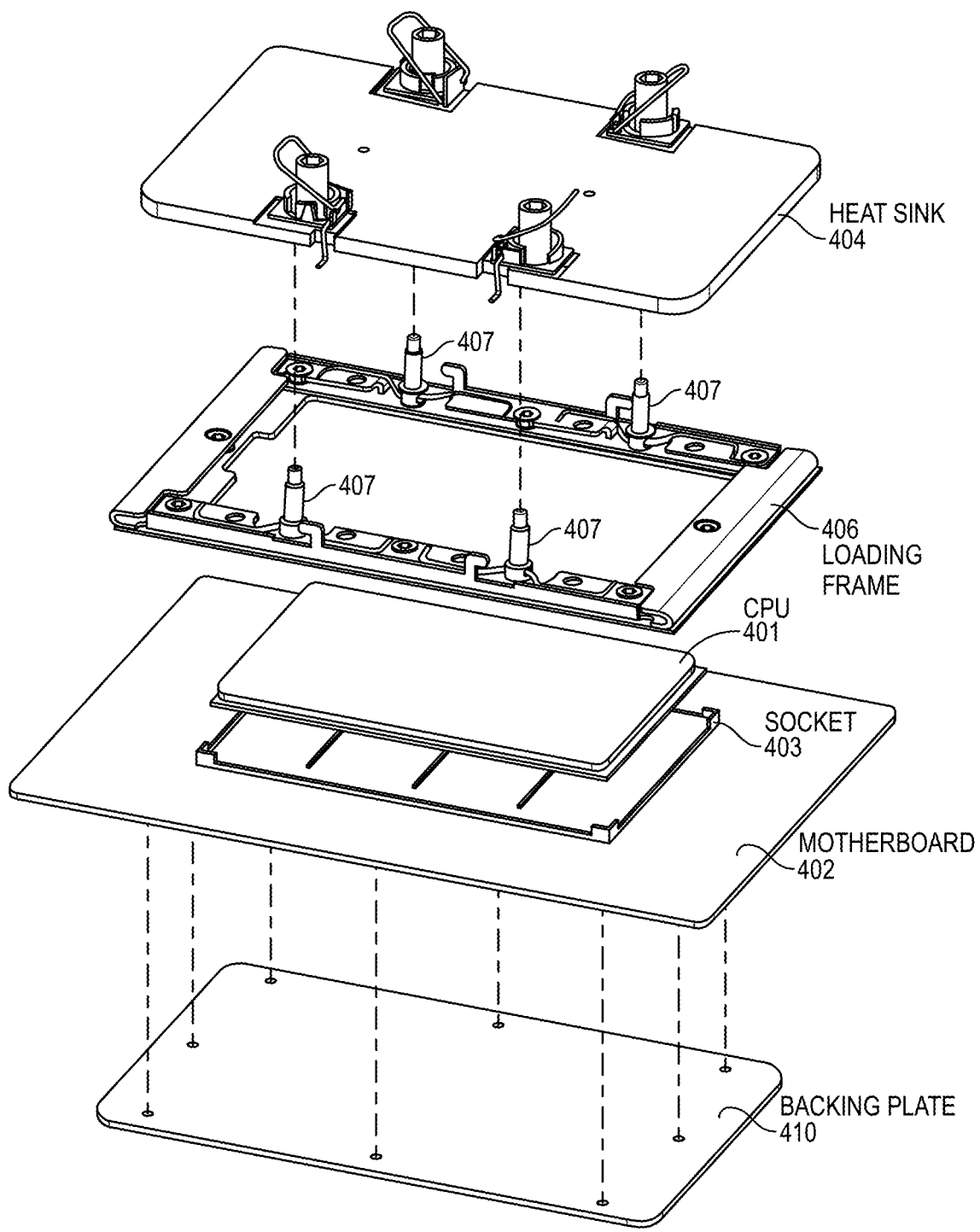
FIG. 4 shows an exploded view of a first embodiment of a CPU with heat sink and socket assembly.

FIG. 4 shows an exploded view of a further improved heat sink mounting assembly. Like the assembly of FIG. 1, the assembly of FIG. 4 includes a CPU 401, motherboard 402, socket 403, heat sink 404, loading frame 406, studs 407, and backing plate 410. The depicted embodiment of FIG. 4 does not include a carrier, however, in various alternate embodiments the assembly could also include a carrier located between the CPU 401 and the loading frame 406.

Figure 5:
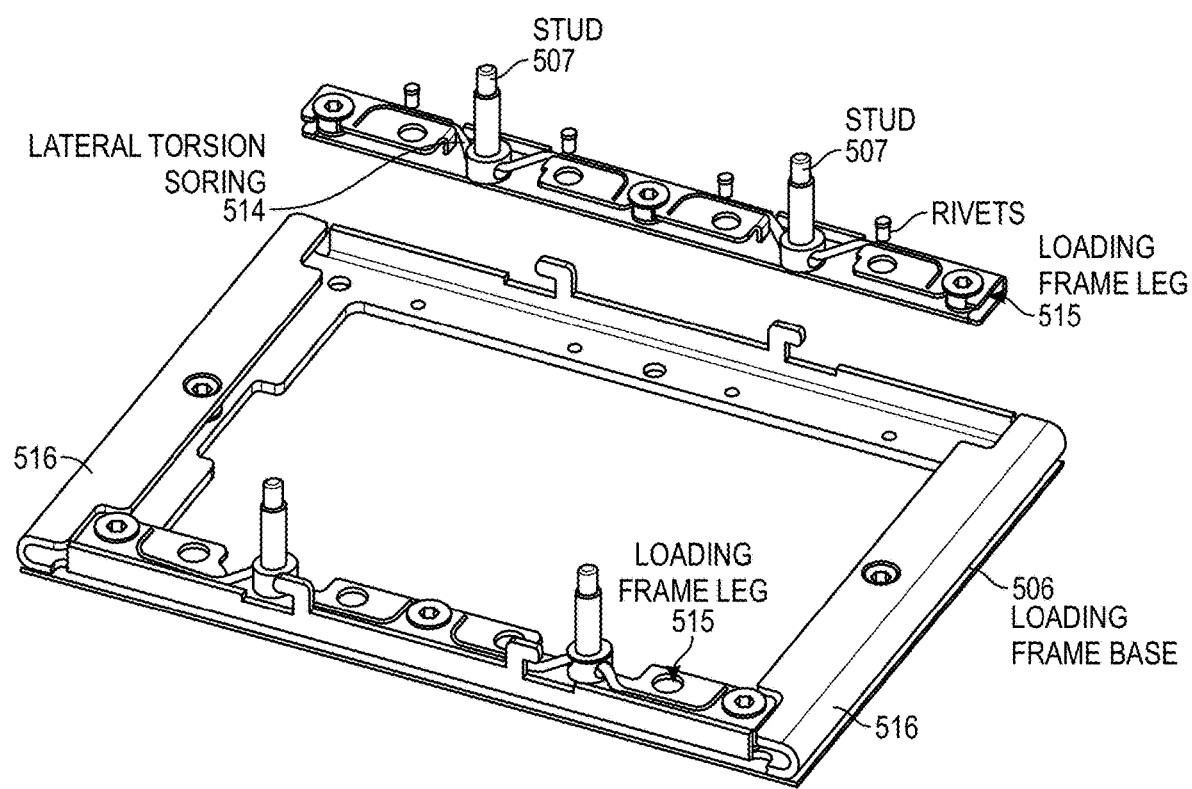
FIG. 5 shows an embodiment of a loading frame.

FIG. 5 shows a more detailed view of the loading frame, which consists of a loading frame base 506 and a pair of loading frame legs 515 that are riveted to the loading frame base 506. The improved loading frame has the following design improvements over the assembly of FIG. 1: 1) studs 507 that are positioned along the loading frame legs 515 rather than in/near the corners of the loading frame; 2) long and short loading frame legs 415, 416 having "C" shaped cross sections; and, 3) a lateral rather than coiled torsion spring 514 for loading frame attachment to the heat sink. Each of these improvements is described in more detail further below.

The loading frame improvements of FIG. 5 is pertinent for future packaging solutions that are expected to embrace CPUs having increased electrical interface "pin" counts (where a pin can be a solder ball or other integrated circuit input/output (I/O) connection). Here, increasing pin count has two consequences that impact the design of the heat sink mounting assembly.

A first consequence is that more heat sink loading force should be applied to the top of the CPU package to ensure at least a minimum amount of loading per pin (to keep each pin in contact with its corresponding socket connection). Said another way, if the heat sink loading force were kept constant and the number of pins is increased, the amount of loading per pin would decrease resulting in insufficient pin/socket contact.

A second consequence of increasing CPU pin count is increased CPU footprint (surface area) size. That is, the array of electrical interface connections on the underside of the CPU becomes physically larger to accommodate more pins, which, in turn, increases the surface area of the CPU package. The increasing of the surface area of the CPU package translates into loading frames having longer frame legs and corresponding window size.

Here, the combination of longer frame legs and increasing loading force results in frame legs that are more likely to bend. As such, the improvements listed above with respect to FIG. 5 are each directed to the prevention of the warping/bending of the frame legs.

Comparing the loading frame of FIG. 5 with the loading frame of FIG. 1, note that whereas the studs 107 of the loading frame 106 of FIG. 1 are located at the corners of the loading frame 106, by contrast, the studs 507 of the improved loading frame of FIG. 5 are dispersed along the (longer) legs 515 of the loading frame. By placing the studs 507 along the longer of the frame legs 517, the loading forces are more evenly distributed around the entire frame (including the frame base 506 when the entire frame is assembled), which, in turn, results in less propensity of any of the frame's legs to bend/bow.

Bowing/bending of all frame legs is also prevented by using legs having a "C" shaped cross section. Here, for instance, as observed in FIG. 6a, the initial frame structure can be manufactured with "flaps" 601, 602 along the shorter legs. The flaps are then bent, e.g., around a cylindrical tool/element, to form a C shape as observed in FIG. 6b.

A leg with a C shape cross section will resist bending/bowing along the length of the leg because the C shape, in a sense, creates a doubling of the arm material thickness. Moreover, the structure remains relatively lightweight (being composed of sheet-like material). Thus, as observed in FIGS. 5 and 6b, the shorter legs are formed in the loading frame base as bent C shapes that can easily withstand higher loading forces, yet, due to its light weight, does not appreciably add, e.g., to the weight presented to the backing plate by the heat sink/CPU/carrier/loading frame assembly.

Figure 6B:
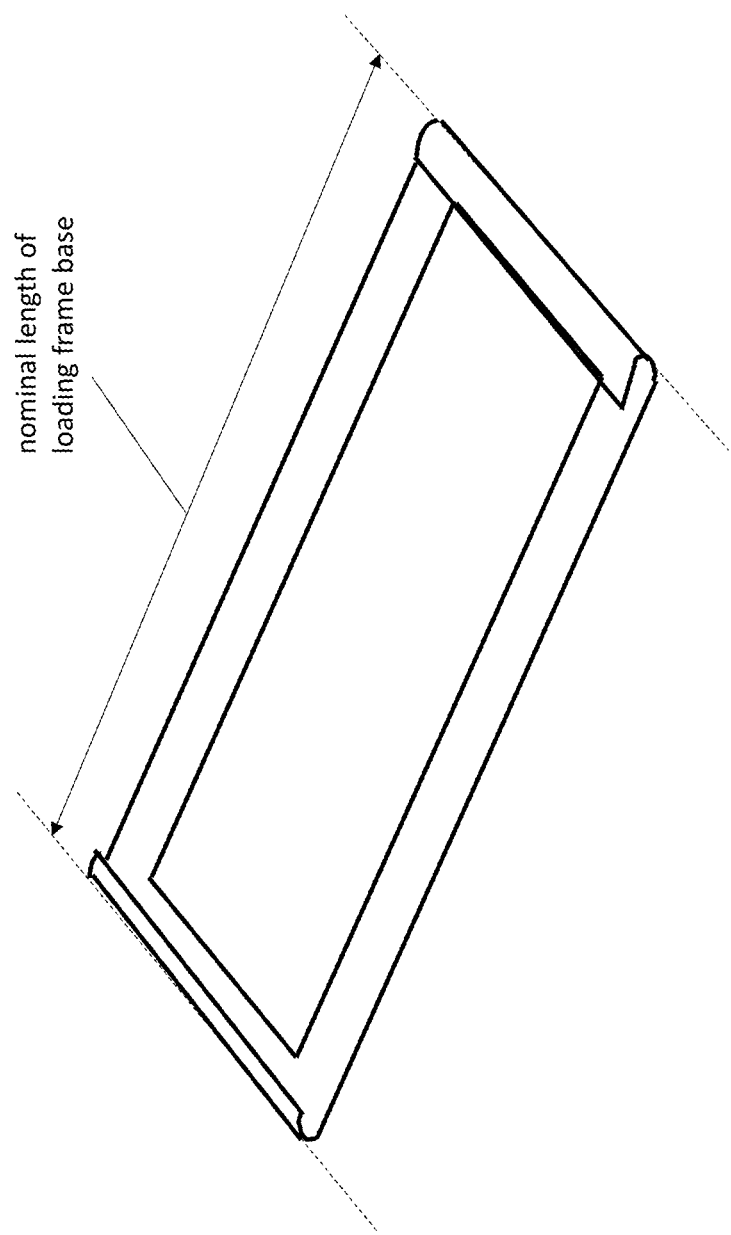

As observed in FIG. 5, the loading frame is a multiple piece assembly that consists of a loading frame base 506 and a pair of long legs 515 that are mounted to the loading frame base 506 along the longer leg dimension. The shorter legs, as described at length just above with respect to FIGS. 6a and 6b, are formed from flaps that run along the loading frame base's shorter leg dimension and are bent back to form a pair of legs each having a C shaped cross section.

Figure 7A:
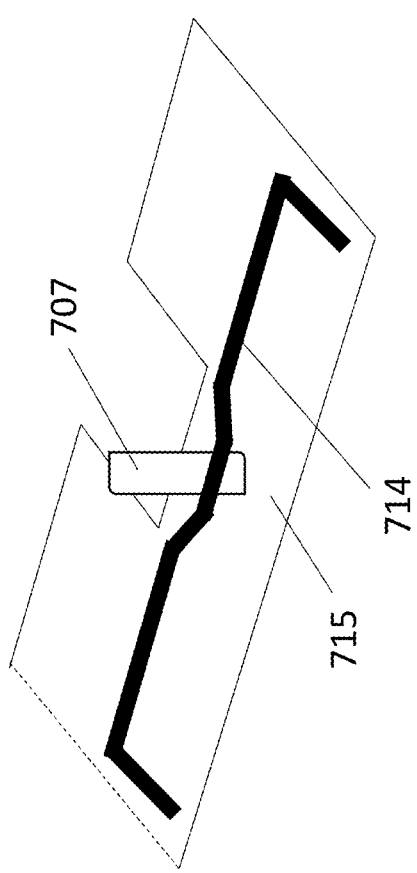
FIGS. 7a and 7b show a loading frame leg segment.
Figure 7B:
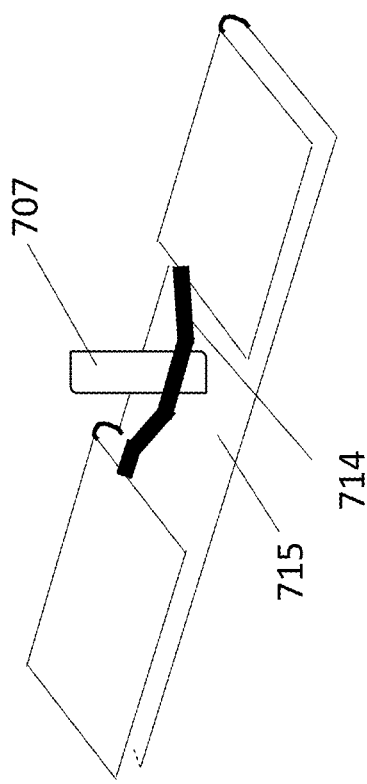

As observed in FIGS. 7a and 7b, a long leg segment 715 is formed from an individual piece of sheet metal having tabs that are bent backward to form a leg segment having a C shaped cross section. Comparing the arms 515 of FIG. 5 with the arm segment 715 of FIG. 7, note that there are two segments per arm. For ease of drawing FIGS. 7a and 7b only show one of the segments. Additionally, a lateral torsion spring 714 is integrated with the segment. Here, according to the particular embodiment of FIGS. 7a and 7b, the lateral torsion spring 714 is laid on the segment metal 715 before the tabs are bent. The tabs are then bent around the torsion spring 714 to form the C shaped cross section of the segment length.

The mid-section of the torsion spring 714, when initially laid on the segment (as in FIG. 7a) is looped into a groove formed a lower portion of the base of the stud 707. The bottom of the stud 707 is coupled to the wire (e.g., the wire is pressed into a groove formed in the base of the stud). Referring back to FIG. 5, the segment/leg 515 is then riveted to the mounting frame base 506.

Subsequently, during assemblage of the heat sink/CPU/loading frame assembly, when the studs are threaded with and tightened to the heat sink nuts, as described above with respect to FIGS. 3a through 3c, the studs will lift upward towards the heat sink and away from the loading frame leg. The upward movement of a stud away from the loading frame leg also lifts the torsion spring segment that is looped through the groove in the stud, which, in turn, induces a rotation of the spring that is resisted by the length of the spring that is clamped in the bent tab (the C cross section). The resistance from the spring translates into a force that tightly pulls the heat sink and loading frame toward one another thereby securing the heat sink to the loading frame.

Figure 8A:
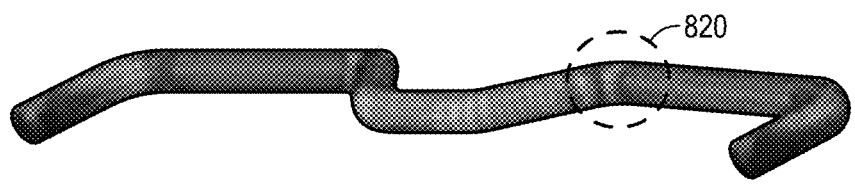
FIGS. 8a and 8b show a lateral torsion spring and its integration with a stud.
Figure 8B:
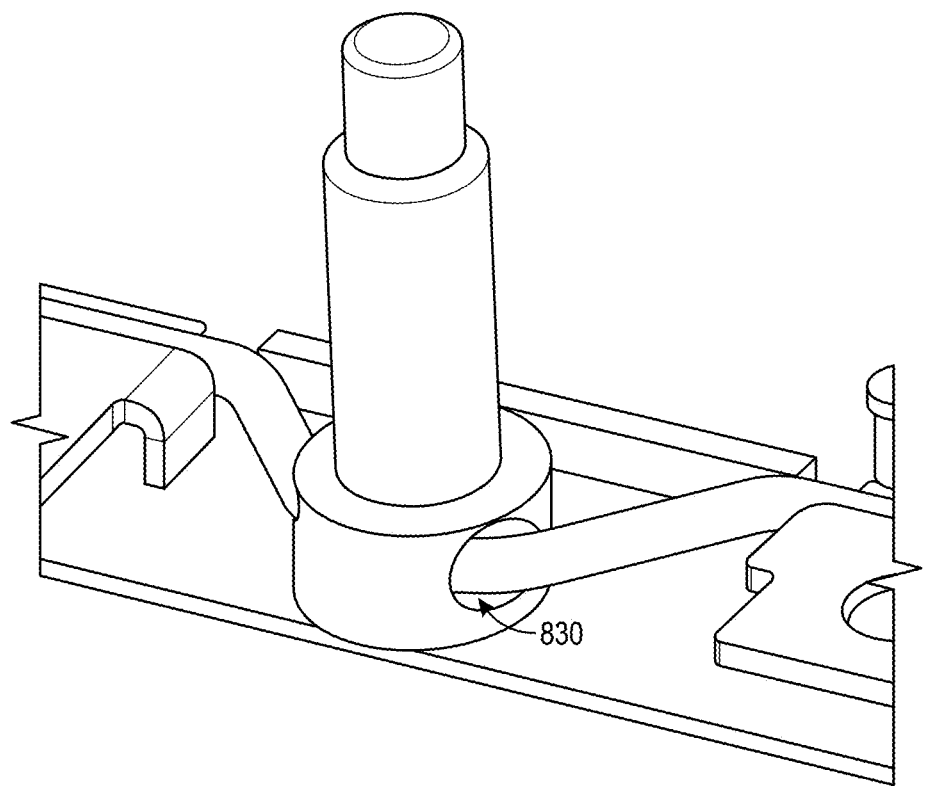

FIG. 8a shows a more detail view of an embodiment of the lateral torsion spring. Notably, the spring can be composed of a single wire of sufficient diameter that is bent to form joints at specific locations of the wire and create the overall finished shape of the wire. Here, joint 820 is a critical joint that observes rotation of the loop section while the sections clamped in the folded back sheet metal remains fixed. FIG. 8b shows a more detailed view of the loop section of the wire and its coupling to the stud. Here, a groove 830 can be seen in the base of the stud that the loop section of the wire fits into. Thus, when the stud rises above the loading frame base in response to the tightening of the nuts on the heat sink, the loop section of the wire will attempt to rotate around joint 820.

Importantly, the lightweight yet structurally firm loading frame solution allows for an assembly that does not require as thick a backplate as other solutions that address the challenges discussed above with a bulkier loading frame and overall assembly. Here, the later approach corresponds to a larger/heavier overall packaging implementation that drives larger system form factors. As high end computing environments, such as data center environments, emphasize integrating as much functionality as possible into as small a volume as possible, it becomes more challenging to satisfy the demands of such environments with a bulkier packaging solution.

As just one example, one CPU manufacturer, in response to having CPU I/O count increase beyond 4,000 I/Os (e.g., to 6,000 I/Os), is expected to increase the backplate thickness (from 2.2 mm to 2.5 mm) to 3 mm or greater. By contrast, with the improved solution described just above, such higher I/O count CPUs can still be mounted with a backplate thickness that is less than 3 mm (e.g., 2.2 mm to 2.5 mm).

It is pertinent to point out that the improved loading frame solution described above with respect to FIGS. 4 through 7a,b,c can also include a shim as described above with respect to FIGS. 1 through 3a,b,c,d,e to, e.g., accommodate a wide range of CPU package thicknesses.

Although embodiments above have stressed a packaging solution for a processor, it is pertinent to point out that any, e.g., high density large scale semiconductor chip could be mounted to a printed circuit board such as a motherboard (e.g., system-on-chip, accelerator chip (e.g., neural network processor, artificial intelligence accelerator), graphics processing unit (GPU), general purpose graphics processing unit (GPGPU), field programmable gate array (FPGA), application specific integrated circuit (ASIC)), an "X" processing unit ("XPU") where "X" can be any processor other than a general purpose processor (e.g., etc. G for graphics, D for data, I for infrastructure, etc.), etc. Further still, the teachings of the instant application can also be applied to heat sink coupling to multi-chip modules and co-packaged semiconductor chip and optical component modules. Notably, the term "packaged semiconductor chip" describes any of these solutions as well.

As mentioned above, the motherboard or other printed circuit board that mounts a large scale semiconductor chip according to the teachings above can be integrated into a chassis of a larger electronic system (e.g., a server, a blade server, a processing/compute sled, a memory sled, a networking system (e.g., a network switch, a network router, etc.).

Any such electronic system chassis can have dimensions that are compatible with an industry standard rack (such as racks having 19" or 23" widthwise openings and having mounting holes for chassis having heights of specific height units (e.g., 1U, 2U, 3U where U=1.75"). One example is the IEC 60297 Mechanical structures for electronic equipment—Dimensions of mechanical structures of the 482.6 mm (19 in) series. Generally, however, a chassis of any dimension is possible.

The electronic system can have interfaces that are compatible with or used to transport signals associated with various data center computing and networking system interconnect technologies. Examples include, e.g., data and/or clocking signals associated with any of Infinity Fabric (e.g., as associated and/or implemented with AMD products) or derivatives thereof, specifications developed by the Cache Coherent Interconnect for Accelerators (CCIX) consortium or derivatives thereof, specifications developed by the GEN-Z consortium or derivatives thereof, specifications developed by the Coherent Accelerator Processor Interface (CAPI) or derivatives thereof, specifications developed by the Compute Express Link (CXL) consortium or derivatives thereof, specifications developed by the Hyper Transport consortium or derivative thereof, Ethernet, Infiniband, NVMe-oF, PCIe, etc.

The electronic system can contain the primary components of an entire computer system (e.g., CPU, main memory controller, main memory, peripheral controller and mass non-volatile storage), or, may contain the functionality of just some subset of an entire computer system (e.g., a chassis that contains primarily CPU processor power, a chassis that contains primarily main memory control and main memory, a chassis that contains primarily a storage controller and storage). The later can be particularly useful for dis-aggregated computing systems.

In the case of a dis-aggregated computer system, unlike a traditional computer in which the core components of a computing system (e.g., CPU processors, memory, storage, accelerators, etc.) are all housed within a common chassis and connected to a common motherboard, such components are instead integrated on separate pluggable cards or other pluggable components (e.g., a CPU card, a system memory card, a storage card, an accelerator card, etc.) that plug-into a larger exposed backplane or network instead of a same, confined motherboard. As such, for instance, CPU computer power can be added by adding CPU cards to the backplane or network, system memory can be added by adding memory cards to the backplane or network, etc. Such systems can exhibit even more high speed card to card connections that traditional computers. One or more dis-aggregated computers and/or traditional computers/servers can be identified as a Point of Delivery (PoD) for computing system function in, e.g., the larger configuration of an information technology (IT) implementation such as a data center.

Figure 9:
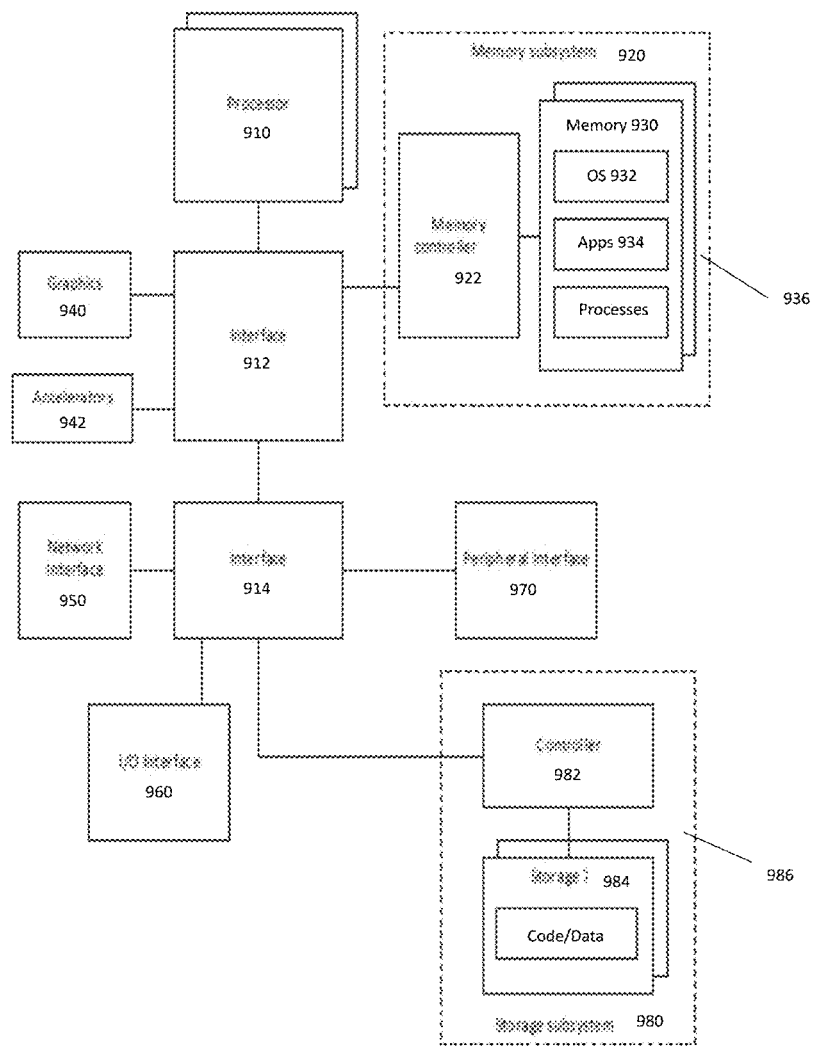
FIG. 9 shows a system.

FIG. 9 depicts an example system. The system can use embodiments described herein to determine a reference voltage to apply to a rank of memory devices and a timing delay of a chip select (CS) signal sent to the rank of memory devices. System 900 includes processor 910, which provides processing, operation management, and execution of instructions for system 900. Processor 910 can include any type of microprocessor, central processing unit (CPU), graphics processing unit (GPU), processing core, or other processing hardware to provide processing for system 900, or a combination of processors. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 900 includes interface 912 coupled to processor 910, which can represent a higher speed interface or a high throughput interface for system components that needs higher bandwidth connections, such as memory subsystem 920 or graphics interface components 940, or accelerators 942. Interface 912 represents an interface circuit, which can be a standalone component or integrated onto a processor die. Where present, graphics interface 940 interfaces to graphics components for providing a visual display to a user of system 900. In one example, graphics interface 940 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 940 generates a display based on data stored in memory 930 or based on operations executed by processor 910 or both. In one example, graphics interface 940 generates a display based on data stored in memory 930 or based on operations executed by processor 910 or both.

Accelerators 942 can be a fixed function offload engine that can be accessed or used by a processor 910. For example, an accelerator among accelerators 942 can provide neural network computation, artificial intelligence computation, compression (DC) capability, cryptography services such as public key encryption (PKE), cipher, hash/authentication capabilities, decryption, or other capabilities or services. In some embodiments, in addition or alternatively, an accelerator among accelerators 942 provides field select controller capabilities as described herein. In some cases, accelerators 942 can be integrated into a CPU socket (e.g., a connector to a motherboard or circuit board that includes a CPU and provides an electrical interface with the CPU). For example, accelerators 942 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 942 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 920 represents the main memory of system 900 and provides storage for code to be executed by processor 910, or data values to be used in executing a routine. Memory subsystem 920 can include one or more memory devices 930 such as read-only memory (ROM), flash memory, volatile memory, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 900 includes interface 914, which can be coupled to interface 912. In one example, interface 914 represents an interface circuit, which can include stand-alone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can transmit data to a remote device, which can include sending data stored in memory. Network interface 950 can receive data from a remote device, which can include storing received data into memory. Various embodiments can be used in connection with network interface 950, processor 910, and memory subsystem 920.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910 or can include circuits or logic in both processor 910 and interface 914.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 900. More specifically, power source typically interfaces to one or multiple power supplies in system 1100 to provide power to the components of system 900. In one example, the power supply includes an AC to DC (alternating current to direct current) adapter to plug into a wall outlet. Such AC power can be renewable energy (e.g., solar power) source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 900 can be implemented as a disaggregated computing system. For example, the system 700 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Figure 10:
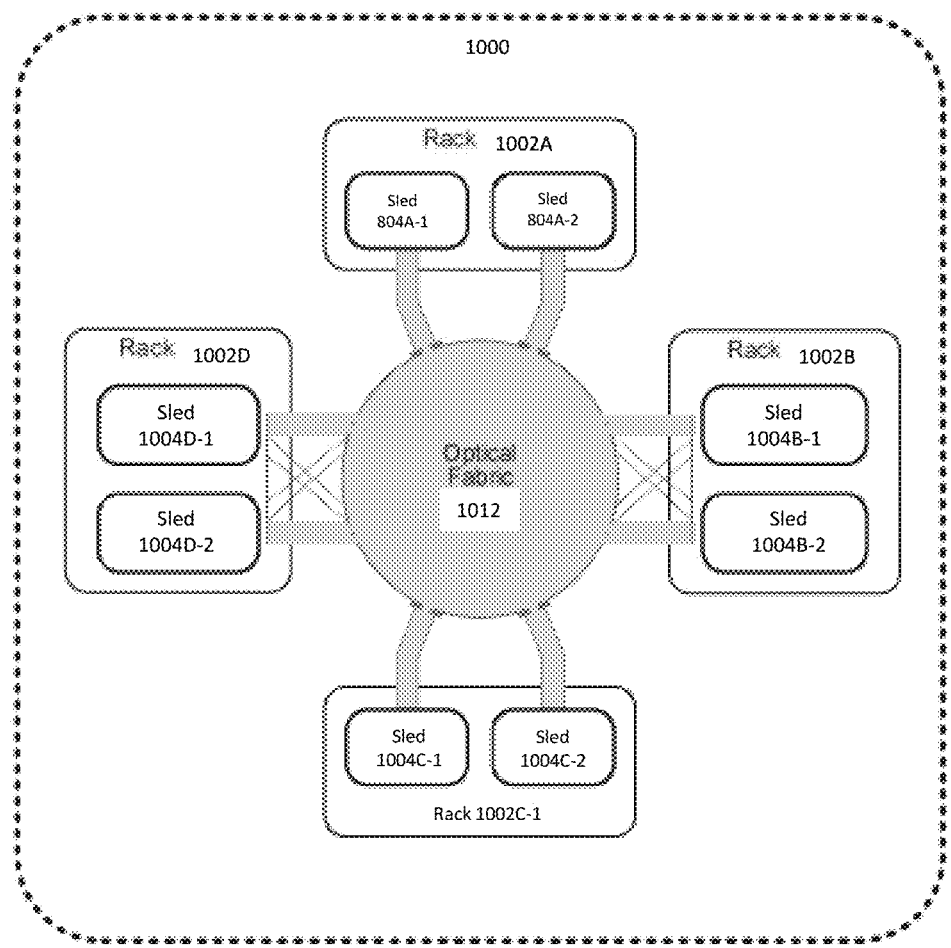
FIG. 10 shows a data center.

FIG. 10 depicts an example of a data center. Various embodiments can be used in or with the data center of FIG. 10. As shown in FIG. 10, data center 1000 may include an optical fabric 1012. Optical fabric 1012 may generally include a combination of optical signaling media (such as optical cabling) and optical switching infrastructure via which any particular sled in data center 1000 can send signals to (and receive signals from) the other sleds in data center 1000. However, optical, wireless, and/or electrical signals can be transmitted using fabric 1012. The signaling connectivity that optical fabric 1012 provides to any given sled may include connectivity both to other sleds in a same rack and sleds in other racks. Data center 1000 includes four racks 1002A to 1002D and racks 1002A to 1002D house respective pairs of sleds 804A-1 and 804A-2, 1004B-1 and 1004B-2, 1004C-1 and 1004C-2, and 1004D-1 and 1004D-2. Thus, in this example, data center 1000 includes a total of eight sleds. Optical fabric 1012 can provide sled signaling connectivity with one or more of the seven other sleds. For example, via optical fabric 1012, sled 804A-1 in rack 1002A may possess signaling connectivity with sled 804A-2 in rack 1002A, as well as the six other sleds 1004B-1, 1004B-2, 1004C-1, 1004C-2, 1004D-1, and 1004D-2 that are distributed among the other racks 1002B, 1002C, and 1002D of data center 1000. The embodiments are not limited to this example. For example, fabric 1012 can provide optical and/or electrical signaling.

Figure 11:
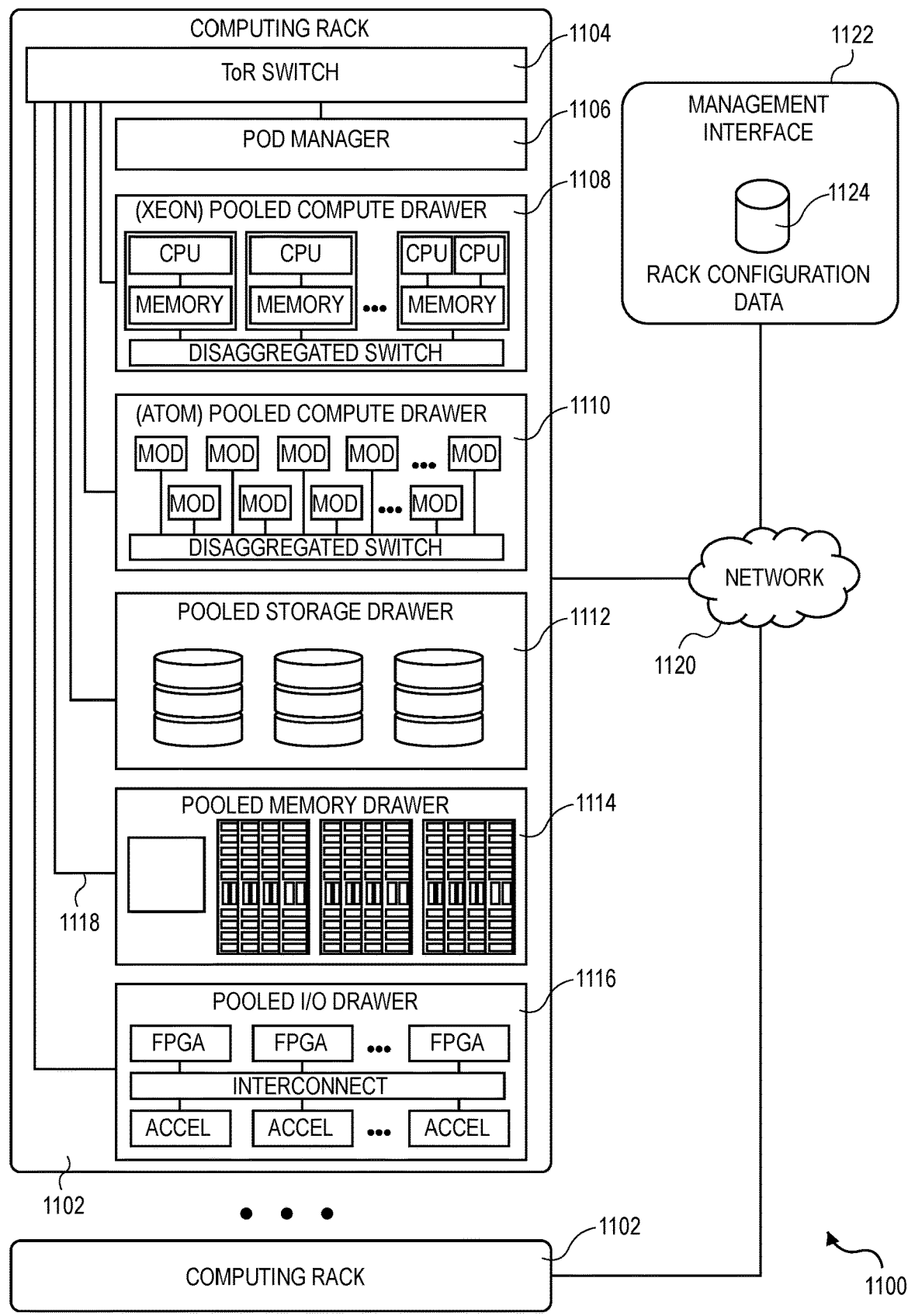
FIG. 11 shows a rack mounted computing environment.

FIG. 11 depicts an environment 1100 includes multiple computing racks 1102, each including a Top of Rack (ToR) switch 1104, a pod manager 1106, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1108, and INTEL® ATOM™ pooled compute drawer 1120, a pooled storage drawer 1112, a pooled memory drawer 1114, and a pooled I/O drawer 1116. Each of the pooled system drawers is connected to ToR switch 1104 via a high-speed link 1118, such as a 40 Gigabit/second (Gb/s) or 100 Gb/s Ethernet link or a 100+Gb/s Silicon Photonics (SiPh) optical link. In one embodiment high-speed link 1118 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1100 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage all of the racks in the pod. Alternatively, distributed pod managers may be used for pod management operations.

RSD environment 1100 further includes a management interface 1122 that is used to manage various aspects of the RSD environment. This includes managing rack configuration, with corresponding parameters stored as rack configuration data 924.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items.

The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
   a packaged semiconductor chip;
   a socket;
   a heat sink for the packaged semiconductor chip; and
   a loading frame for mounting the packaged semiconductor chip and the heat sink to the socket, wherein the loading frame comprises a loading frame base coupled to at least one frame leg, and wherein the at least one frame leg comprises metal folded inward on an edge of the at least one frame leg to form a C shaped cross section.

2. The apparatus of claim 1 wherein the at least one frame leg is mounted to the loading frame base.

3. The apparatus of claim 1 wherein the at least one frame leg comprises multiple studs dispersed along a run length of the at least one frame leg.

4. The apparatus of claim 3 wherein at least one of the multiple studs is coupled to a lateral torsion spring having a section that is clamped in the folded metal.

5. The apparatus of claim 1 wherein two of the loading frame's frame legs are folded inward on an edge of the respective frame leg.

6. The apparatus of claim 1 wherein the packaged semiconductor chip has at least 6,000 electronic connections for connecting to the socket.

7. The apparatus of claim 6 wherein a backing plate that is to secure the loading frame to a printed circuit board is less than 3 mm thick.

8. An apparatus, comprising:
   an electronic system, the electronic system comprising i) through iv) below:
   i) a printed circuit board, the printed circuit board comprising a socket;
   ii) a packaged semiconductor chip plugged into the socket;
   iii) a heat sink on the packaged semiconductor chip; and,
   iv) a loading frame coupled between the heat sink and the printed circuit board, wherein the loading frame comprises a loading frame base coupled to at least one frame leg, and wherein the at least one frame leg comprises metal folded inward on an edge of the at least one frame leg to form a C shaped cross section.

9. The apparatus of claim 8 wherein the at least one frame leg is mounted to the loading frame base.

10. The apparatus of claim 8 wherein the at least one frame leg comprises multiple studs dispersed along a run length of the at least one frame leg.

11. The apparatus of claim 8 wherein the at least one frame leg comprises a stud that is coupled to a lateral torsion spring having a section that is clamped in the folded metal.

12. The apparatus of claim 8 wherein two of the loading frame's frame legs are folded inward on an edge of the respective frame leg.

13. The apparatus of claim 8 wherein there are at least 6,000 electronic connections between the packaged semiconductor chip and the socket.

14. The apparatus of claim 13 wherein the printed circuit board is fixed between the loading frame and a backing plate, and wherein the backing plate is less than 3 mm thick.

15. An apparatus, comprising:
a data center, the data center comprising multiple racks, the multiple racks having multiple electronic systems that are communicatively coupled by way of at least one optical channel, wherein, an electronic system of the multiple electronic systems comprises i) through iv) below:

i) a printed circuit board, the printed circuit board comprising a socket;

ii) a packaged semiconductor chip plugged into the socket;

iii) a heat sink on the packaged semiconductor chip; and, iv) a loading frame coupled between the heat sink and the printed circuit board, wherein the loading frame comprises a loading frame base coupled to at least one frame leg, and wherein the at least one frame leg comprises metal folded inward on an edge of the at least one frame leg to form a C shaped cross section.

16. The apparatus of claim 15 wherein the at least one frame leg is mounted to the loading frame base.

17. The apparatus of claim 15 wherein the at least one frame leg comprises multiple studs dispersed along a run length of the at least one frame leg.

18. The apparatus of claim 15 wherein the at least one frame leg comprises a stud that is coupled to a lateral torsion spring having a section that is clamped in the folded metal.

19. The apparatus of claim 15 wherein there are at least 6,000 electronic connections between the packaged semiconductor chip and the socket.

20. The apparatus of claim 19 wherein the printed circuit board is fixed between the loading frame and a backing plate, and wherein the backing plate is less than 3 mm thick.

* * * * *